United States Patent
Jung et al.

(10) Patent No.: US 6,528,385 B2
(45) Date of Patent: Mar. 4, 2003

(54) METHOD FOR FABRICATING A CAPACITOR

(75) Inventors: Tae-Woo Jung, Ichon-shi (KR); Hean-Cheol Lee, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/942,958

(22) Filed: Aug. 31, 2001

(65) Prior Publication Data

US 2002/0052090 A1 May 2, 2002

(30) Foreign Application Priority Data

Aug. 31, 2000 (KR) .......................................... 2000-51277

(51) Int. Cl.[7] .......................... H01L 29/76; H01L 29/94; H01L 31/62; H01L 31/113

(52) U.S. Cl. .......................... 438/396; 397/253; 397/254

(58) Field of Search ................................ 438/253, 254, 438/255, 396, 397, 398, 399; 257/309

(56) References Cited

U.S. PATENT DOCUMENTS

| | | | |
|---|---|---|---|
| 5,597,755 A | | 1/1997 | Ajika et al. |
| 5,895,250 A | * | 4/1999 | Wu ............................. 438/396 |

* cited by examiner

Primary Examiner—Olik Chaudhuri
Assistant Examiner—Theresa T. Doan
(74) Attorney, Agent, or Firm—Pillsbury Winthrop LLP

(57) ABSTRACT

An improved method for fabricating a capacitor capable of reducing defects introduced as a result of complicated processes required to separate the bottom electrodes of the capacitors is provided to thereby enhance the yield of the resulting semiconductor devices. The method comprises forming an insulating film on a substrate; selectively etching the insulating film to open regions for the formation of the bottom electrode; depositing a conductive layer on the substrate including the opened regions; forming a photoresist pattern; and then, preferably in a single etch chamber, completing the process by removing the conductive layer in the peripheral circuit region; etching back the photoresist pattern to expose the conductive layer in the cell region; etching back the conductive layer to form the bottom electrodes; and removing any residual photoresist.

19 Claims, 5 Drawing Sheets

METHOD FOR FABRICATING A CAPACITOR

FIELD OF THE INVENTION

The present invention relates to a method for the fabrication of capacitor and, more particularly, to a method for fabricating a capacitor that is capable of reducing defects incurred during the separation of capacitor.

DESCRIPTION OF THE PRIOR ART

FIGS. 1A to 1C are schematic cross-sectional views illustrating a prior art method for the fabrication of capacitor.

As shown in FIGS. 1A, an interlayer insulating film 12 is disposed on a semiconductor substrate 11 obtained by a predetermined process, followed by the deposition of an interlayer insulating film 12 that is selectively etched to form a contact hole for a storage node of the capacitor. Next, a conductive layer is disposed on the whole surface including the contact hole, and a storage node contact plug 13 is formed using an etchback process or a chemical-mechanical polishing (CMP) process. Wherein the storage node contact plug 13 is connected to the semiconductor substrate 11 through the contact hole and has a double layered structure.

In an ensuing step, a capacitor oxidation film 14 is formed on the whole surface, including the storage node contact plug 13, and a mask for defining the capacitor is then formed thereon. Subsequently, the capacitor oxidation film 14 is selectively etched using the mask to thereby expose a portion on which a bottom electrode of the capacitor is to be formed (i.e., a portion to which the storage node contact plug 13 is exposed). Thereafter, the interlayer insulating film 12 and the capacitor oxidation film 14 in a peripheral circuit region II are selectively etched to form an alignment key box pattern 15.

After the above step, a polysilicon layer 16, for the bottom electrode is formed on the whole surface including the exposed portion. A mask 17 is disposed thereon through the use of a photosensitive film serving to expose the peripheral circuit region II.

As shown in FIG. 1B, the polysilicon 16 in the peripheral circuit region II is etched using the mask 17, after which a distinct bottom electrode 16a is formed using the CMP process. In this case, a photosensitive film 17a remains within the contact hole in the bottom electrode 16a.

As shown in FIG. 1C, the photosensitive film 17a remaining within the bottom electrode 16a is then removed.

The prior art method suffers from a drawback, in that, it employs the chemical mechanical polishing process for the separation of the capacitors, resulting in an excessive height loss of the capacitor and various defects resulting from various causes, e.g., slurry residue, broken portions of the capacitor structure, dishing, and particles, which, in turn, deteriorates the yield of the resulting semiconductor device.

In addition, the prior art method must utilize four distinct pieces of equipment such as equipment for removal of the polysilicon in the peripheral circuit region II, equipment for the chemical-mechanical polishing, equipment for stripping away the photosensitive film and equipment for the wet etch. As a result of the need for these various pieces of equipment and the associated handling, the prior art process suffers from a shortcoming in that it increases the number of defect sources and increases the process time, both of which tend to deteriorate the yield of semiconductor device.

SUMMARY OF THE INVENTION

It is, therefore, a primary object of the present invention to provide a method for fabricating capacitors that is capable of reducing defects introduced as the result of the complicated process during the separation of capacitor, to thereby enhance the yield of the resulting semiconductor device.

In accordance with a preferred embodiment of the present invention, there is provided a method for the fabrication of capacitor, comprising the steps of: forming an insulating film on a semiconductor substrate in which a cell region and a peripheral circuit region are defined; selectively etching the insulating film, followed by opening a region in which a bottom electrode will be formed; depositing a conductive layer for the bottom electrode on the whole surface, including the opened region; forming a photosensitive film pattern that exposes the peripheral circuit region; removing the conductive layer in the peripheral circuit region using the photosensitive film as a mask; applying an etchback process to the photosensitive film to expose the conductive layer in the cell region; applying an etchback process to the conductive layer until the insulating film covered with the conductive layer is exposed, to thereby form a distinct bottom electrode; and stripping away the remaining photosensitive film.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

FIGS. 2A to 2E are schematic cross-sectional views illustrating a method for fabricating a capacitor in accordance with a preferred embodiment of the present invention.

Figure 1A:
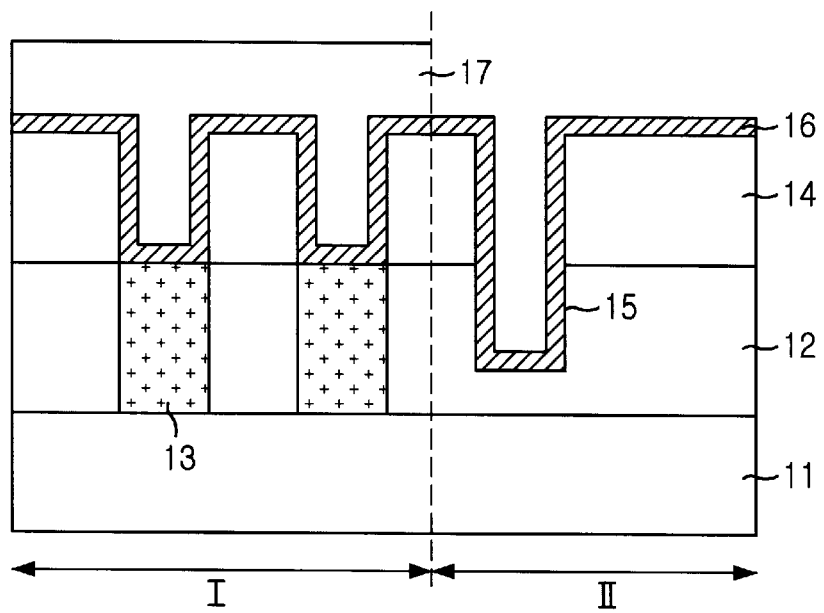
FIGS. 1A to 1C are cross-sectional views illustrating a prior art method for the fabrication of capacitor.
Figure 1B:
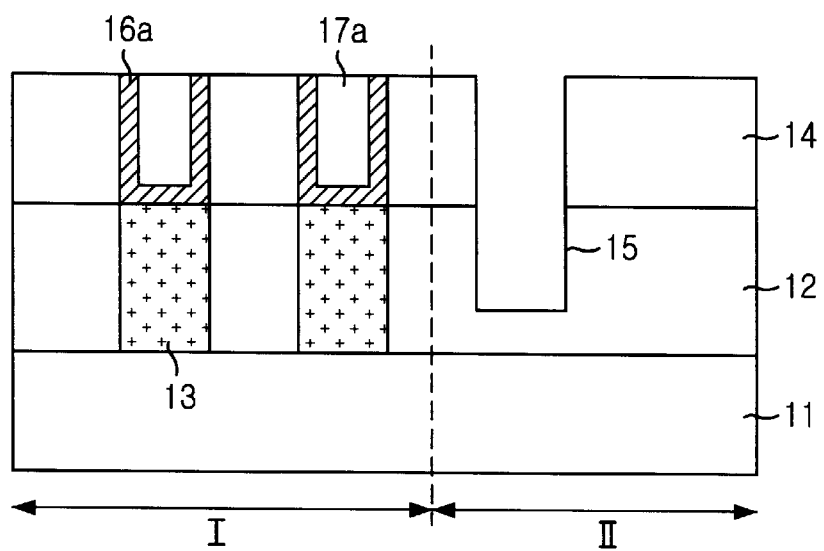
Figure 1C:
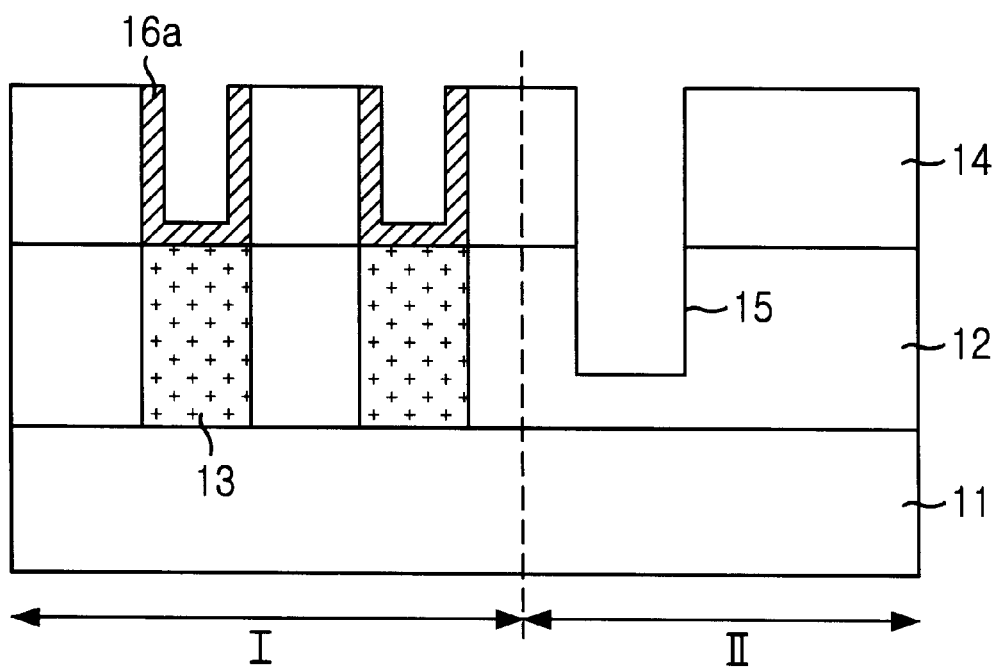
Figure 2A:
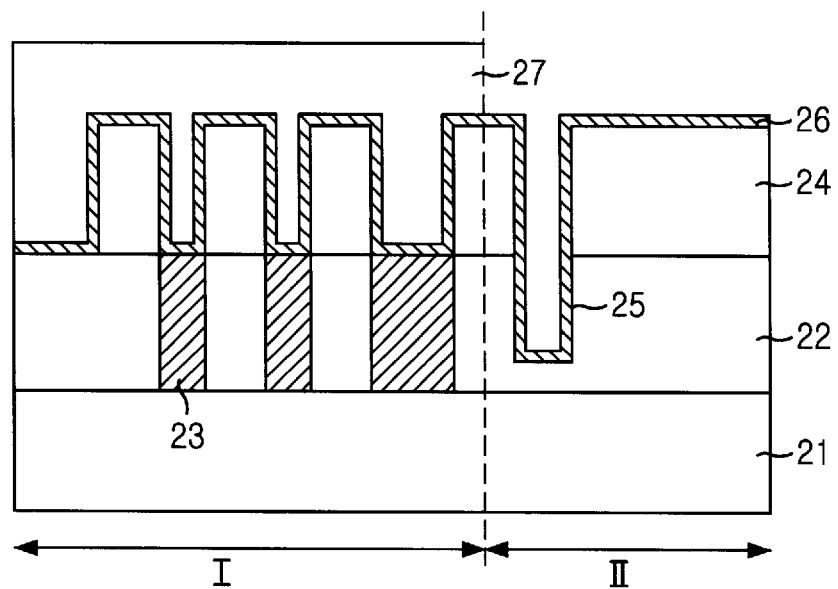
FIGS. 2A to 2E are cross-sectional views illustrating a method for fabricating a capacitor in accordance with a preferred embodiment of the present invention.

As shown in FIG. 2A, an interlayer insulating film 22 is deposited on a semiconductor substrate 21 obtained by a predetermined process. The interlayer insulating film 22 is then selectively etched to form a contact holes for storage nodes. Next, a conductive layer is deposited the whole surface including the contact holes, followed by a selective removal process that is applied to the conductive layer to form a storage node contact plug 23, which is connected to the semiconductor substrate 21 through the contact hole. In this case, the storage node contact plug 23 is formed only the cell region I in which the capacitors will be formed.

Before the formation of the storage node contact plug 23, word lines (not shown) are formed on the semiconductor substrate 21, followed by the formation of source-drain regions using an impurity ion implantation using the wordline pattern as an implant mask. In an ensuing step, a first contact plug (not shown) is formed to provide a vertical connection between an impurity junction layer and the wordlines. Next, a wordline insulating film (not shown) is formed on the first contact plug followed by a bit line pattern (not shown) is formed thereon. After the above step, formed is a contact hole to which the first contact plug is exposed. And then, a conductive layer for forming the plug is formed the whole surface including the contact hole, followed by a second contact plug to be connected to The first contact plug is formed using a chemical-mechanical polishing process until the wordline insulating film is exposed.

In this case, the second contact plug represents the storage node contact plug 23 and the interlayer insulating film 22 represents the wordline insulating film.

In a subsequent step, a capacitor oxidation film 24 having a thickness range of 8,000 Å to 18,000 Å is formed on the whole surface, including the storage node contact plug 23. The capacitor oxidation film 24 is preferably formed from either tetraethylorthosilicate (TEOS) or boron phosphorus silicate glass (BPSG) material. The capacitor oxidation film 24 is then selectively etched to open a region at which a bottom electrode will be formed and expose the storage node contact plug 23. The capacitor oxidation film 24 and the interlayer insulating film 22 in the peripheral circuit region II are also selectively etched to form an alignment key box pattern 25.

A polysilicon layer for forming the bottom electrode 26 ranging in thickness from 400 Å to 600 Å is then formed on the whole surface, including the opened region. Next, a photosensitive film pattern 27 is formed to expose the peripheral circuit region II to remove the polysilicon of the alignment key box pattern 25, wherein the peripheral circuit region II causes a lifting up of the bottom electrode during a wet etching of the capacitor oxidation film 24 exposing the subsequent bottom electrode. In this case, the photosensitive film 27 is formed so that it is applied to the whole surface including the polysilicon for bottom electrode 26, followed by exposing and developing the photosensitive film 27, thereby exposing the peripheral circuit region II.

Figure 2B:
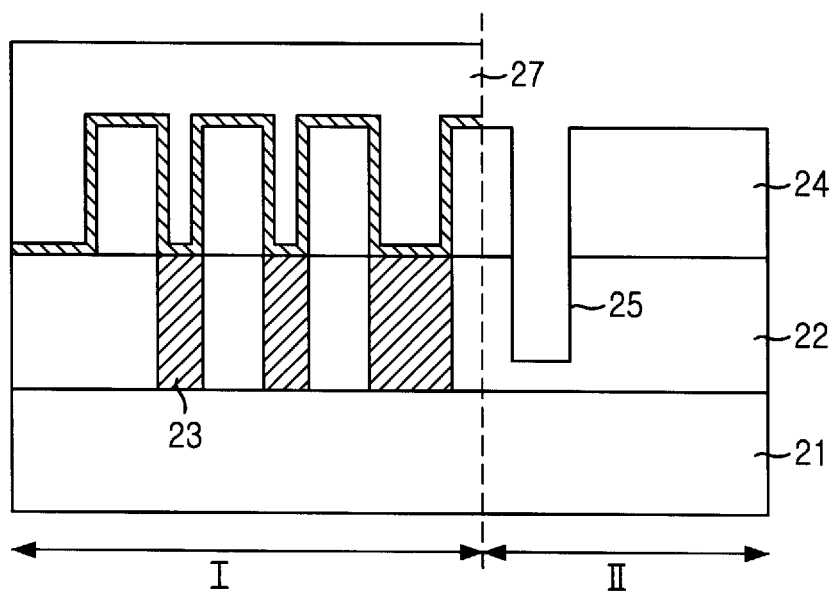

As shown in FIG. 2B, the semiconductor substrate 21 on which the photosensitive film 27 is formed is introduced to an isotropic etcher. In the isotropic etcher, a pressure of 300 to 1000 mTorr is maintained, a properly mixed gas of $CF_4$, $NF_3$ as a main etching gas and $O_2$ as a feed gas is introduced, and a downstream microwave power of 700 W to 1800 W and a radio frequency bias power of 50 W to 100 W are applied.

First, the polysilicon for bottom electrode 26 in the peripheral circuit region II is etched using the isotropic etcher under conditions that provide a selection ratio for the capacitor oxidation film 24 of 4:1 to 10:1. In this case, the etching of the polysilicon for bottom electrode 26 is performed in condition that the microwave power (MW), radio frequency bias power (RF), pressure, $CF_4$, $O_2$, $NF_3$, chamber sidewall temperature and chamber bottom temperature are 900–1600 W, 0–450 W, 500–1000 mtorr, 20–100 sccm, 500–1000 sccm, 20–40 sccm, 10–90° C. and 10–90° C., respectively.

| Parameter | Preferred Value |
| --- | --- |
| Microwave Power | 900–1600 W |
| RF Bias Power | 0–450 W |
| Pressure (Chamber) | 500–1000 mTorr |
| $CF_4$ Flow | 20–100 sccm |
| $O_2$ Flow | 50–1000 sccm |
| $NF_3$ Flow | 20–40 sccm |
| Chamber Sidewall Temp | 10–90° C. |
| Chamber Bottom Temp | 10–90° C. |

For example, applying the isotropic etching to the polysilicon 26 under conditions of 1000 W(MW)/150 W(RF)/700 mTorr/200 $CF_4$/100 $O_2$/70° C.

| Parameter | Value |
| --- | --- |
| Microwave Power | 1000 W |
| RF Bias Power | 150 W |
| Pressure (Chamber) | 700 mTorr |
| $CF_4$ Flow | 200 sccm |
| $O_2$ Flow | 100 sccm |
| $NF_3$ Flow | 0 sccm |
| Chamber Sidewall Temp | 70° C. |
| Chamber Bottom Temp | 70° C. | and an etching rate with 7,340 Å/minute ±7%, with the polysilicon 26 having a thickness 500 Å and the alignment key box pattern 25 having a depth of 15,000 Å even if an etch target is set to a thickness of 5,000 Å A it is possible to completely remove the polysilicon 26 within the align key box pattern 25.

Figure 2C:
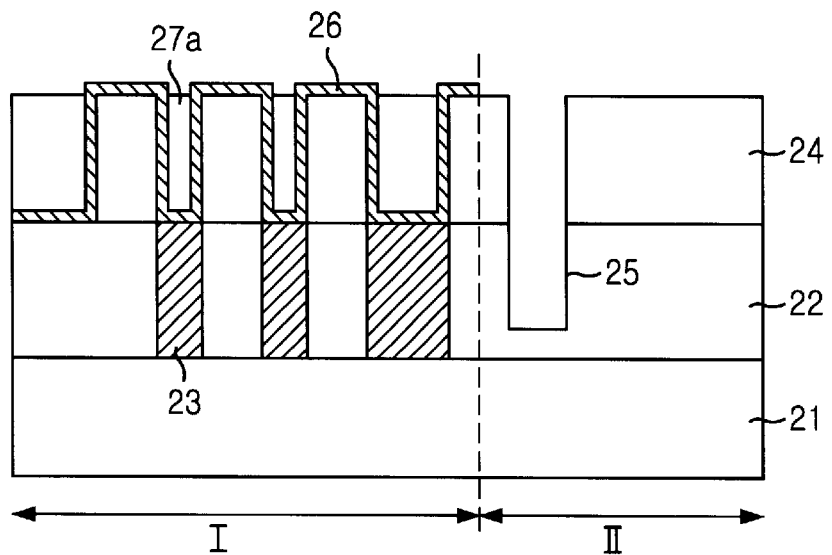

As shown in FIG. 2C, in the same isotropic etcher, an etchback process is then conducted to remove the majority of the photosensitive film 27 while allowing some photosensitive film (27a) to remain within the contact holes in the polysilicon 26. In this case, a point at the photosensitive film is exposed only in the contact holes is determined through the use of an end point detector, under condition that a temperature in the chamber, a flow meter of oxygen, RF power and non-uniformity are maintained in the ranges of 20 to 90° C., 200 to 600 sccm, 100 to 450 W and less than 3%, respectively For example, using a recipe with 420 W(RF)/400 $O_2$/300 mT/70° C.(W)/60° C.(E), the etching rate of 6,690 Å/minute ±7% is applied. Wherein the 70° C.(W) represents the temperature of the chamber sidewall and the 60° C.(E) represents the temperature of the chamber bottom on which the wafer is disposed.

As mentioned above, in the same equipment used to remove the polysilicon 26 in the peripheral circuit region II, it is possible to improve the uniformity of the etchback for the photosensitive film 27 by only using the oxygen and the RF bias power, and achieve delicate control of the etching rate of the photosensitive film using a process temperature of 70° C. and the end point detection.

Figure 2D:
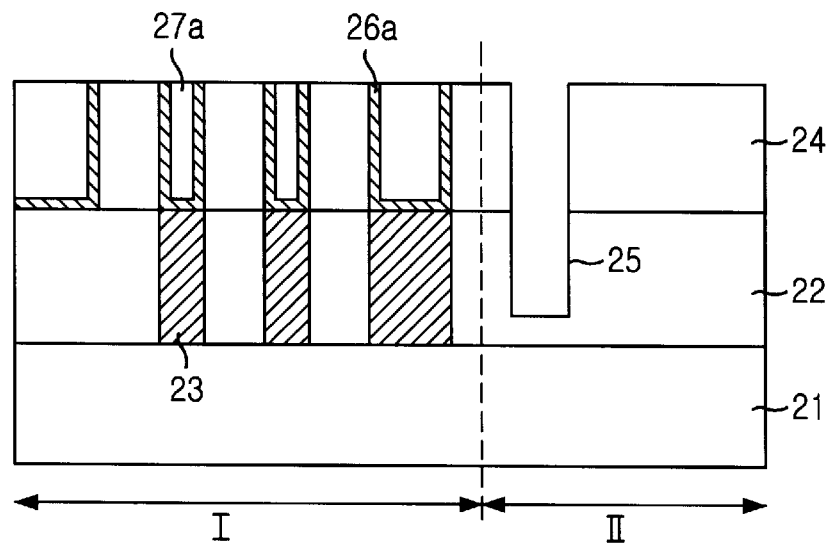

The preceding step is then followed by applying an etchback process to a portion of the polysilicon 26 which is exposed by the etchback for the photosensitive film 27 in the same chamber, to form a distinct bottom electrode 26a as shown in FIG. 2D. The etchback process using a mixed gas of $NF_3$/$CF_4$/He is introduced under conditions that provide an etch selection ratio between the polysilicon 26 and the photosensitive film 27a remaining at the contact hole is in the range of 1:1 to 3:1 and that between the capacitor oxidation film 24 and the photosensitive film 27a is in the range of 0.8:1 to 1.5:1.

In this case, the microwave power, the RF power and the pressure are in the ranges of 900 to 1600 W, 0 to 450 W and 500 to 1000 mTorr, respectively. Further, the $NF_3$, the $CF_4$ and $H_2$ are in the ranges of 10 to 40 sccm, 20 to 100 sccm and 500 to 1000 sccm, respectively.

At an ensuing step, the photosensitive film 27a remaining in the contact hole in the bottom electrode 26a is stripped away under conditions in which the microwave power is in the range of 1000 to 1800 W, a mixed gas or a distinct gas of $O_2$ and $N_2$ is introduced, a temperature in heating lamp in the chamber ranges from 200° C. to 280° C., a temperature of the chamber wall is about 70° C. During the strip away of the photosensitive film 27a, the pressure, $O_2$ and $N_2$ are preferably in the ranges of 500 to 1000 mTorr, 1000 to 4000 sccm and 100 to 400 sccm, respectively.

Figure 2E:
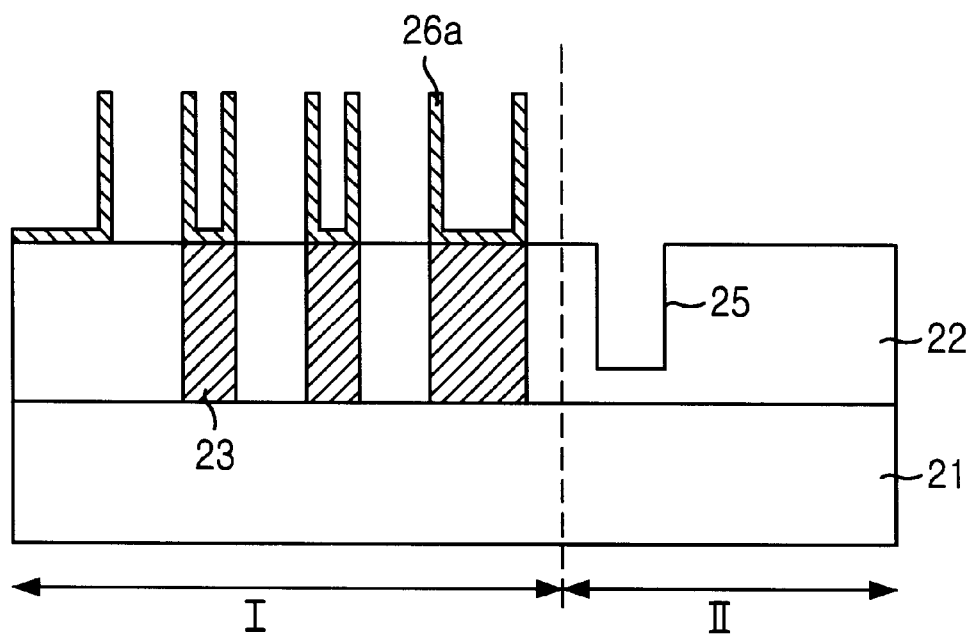

After the above step, as shown in FIG. 2E, a wet etch process is than applied to the capacitor oxidation film 24 to expose the bottom electrode 26a. The wet etch process uses a amine solvent ACT™ or $H_2SO_4:H_2O_2=50:1$ at a temperature ranging from 100° C. to 120° C., for 10 to 20 minutes followed by a buffered oxide etchant (BOE) with a ratio of 300:1 for 2 to 10 seconds.

As demonstrated above, the present invention has the ability to implement an etching process for a polysilicon, an etchback process for a photosensitive film, an etchback process for polysilicon for separating a bottom electrode, and a stripping process for the photosensitive film, in a single piece of equipment, thereby providing a simplified process, decreased defects and improved yield.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for the fabrication of capacitor, comprising:
   (a) forming an insulating film on a semiconductor substrate, the semiconductor substrate having a cell region and a peripheral circuit region;
   (b) selectively etching the insulating film to form electrode openings, the electrode openings having a bottom and sidewalls;
   (c) disposing a conductive layer on a surface of the semiconductor substrate, the sidewalls of the electrode openings, and the bottom of the electrode openings;
   (d) forming a photoresist etch mask that covers a portion of the conductive layer in the cell region and exposes a portion of the conductive layer in the peripheral circuit region;
   (e) removing the exposed portion of the conductive layer from the peripheral circuit region;
   (f) etching the photoresist etch mask using an etchback process to expose a surface of the conductive layer formed on the surface of the substrate in the cell region;
   (g) etching the exposed surface of the conductive layer in the cell region using an etchback process to remove the conductive layer from the surface of the substrate, to separate a portion of the conductive layer remaining on the sidewalls and bottom of each electrode opening, and to form a distinct bottom electrode in each electrode opening; and
   (h) removing a residual portion of the photoresist etch mask from the electrode holes.

2. The method of claim 1, wherein the steps (e) to (h) are performed in a single piece of equipment.

3. The method of claim 1, wherein the insulating film comprises at least one material selected from a group consisting of tetraethylorthosilicate (TEOS) and borophosphosilicate glass (BPSG).

4. The method of claim 3, wherein the insulating film comprises a stacked structure comprising at least one layer of tetraethylorthosilicate (TEOS) and one layer of borophosphosilicate glass (BPSG).

5. The method of claim 1, wherein the conductive layer comprises polysilicon.

6. The method of claim 1, wherein the step of removing the conductive layer in the peripheral circuit region (e) further comprises a plasma etch having an etch selection ratio between the conductive layer and the insulating film of at least 4:1 and not greater than 10:1.

7. The method of claim 6, wherein the step of removing the conductive layer in the peripheral circuit region (e) further comprises the application of between 900 W and 1600 W of microwave power and up to 450 W of radio frequency bias power.

8. The method of claim 7, wherein the step of removing the conductive layer in the peripheral circuit region (e) further comprises establishing a plasma etch pressure of between 500 and 1000 mTorr, a chamber sidewall temperature of between 10 and 90° C., and a chamber bottom temperature between 10 and 90° C.

9. The method of claim 8, wherein the step of removing the conductive layer in the peripheral circuit region (e) further utilizes as process gases $CF_4$, having a flowrate between 20 sccm and 100 sccm, $O_2$, having a flowrate between 500 sccm and 1,000 sccm, and $NF_3$, having a flowrate between 20 sccm and 40 sccm.

10. The method of claim 1, wherein the step of etching the photoresist etch mask (f) further comprises a plasma etch utilizing a chamber temperature between 20° C. and 90° C., an $O_2$ flowrate of between 200 sccm and 600 sccm, and a radio frequency power of between 100 W and 450 W.

11. The method of claim 10, wherein the step of etching the photoresist etch mask (f) utilizes an end point detection process for determining when to terminate the plasma etch.

12. The method of claim 1, wherein the step of etching the exposed surface of the conductive layer in the cell region (g) further comprises a plasma etch having a first etch selection ratio between the conductive layer and the photosensitive film that is between 1:1 and 3:1 and a second etch selection ratio between the insulating film and the photosensitive film that is between 0.8:1 and 1.5:1.

13. The method of claim 12, wherein the step of etching the exposed surface of the conductive layer in the cell region (g) utilizes plasma etch conditions comprising a microwave power between 900 W and 1,600 W, a radio frequency bias power of not more than 450 W, and a chamber pressure between 500 mTorr to 1,000 mTorr.

14. The method of claim 13, wherein the step of etching the exposed surface of the conductive layer in the cell region (g) further utilizes as process gases $NF_3$, having a flowrate between 10 sccm and 40 sccm, $CF_4$, having a flowrate between 20 sccm and 100 sccm, and He, having a flowrate between 500 sccm and 1,000 sccm.

15. The method of claim 1, wherein the step of removing a residual portion of the photoresist etch mask (h) further comprises a plasma etch process in a chamber utilizing a microwave power between 1,000 W and 1,800 W and a process gas comprising a gas selected from a group consisting of $O_2$, $N_2$, and a mixture of $O_2$ and $N_2$.

16. The method of claim 15, wherein the step of removing a residual portion of the photoresist etch mask (h) further comprises a heating lamp positioned in the chamber, the temperature of the heating lamp being between 200° C. and 280° C., and utilizes a pressure in the chamber between 500 mTorr and 1,000 mTorr.

17. The method of claims 1 or 15, wherein the step of removing a residual portion of the photoresist etch mask (h) further comprises an $O_2$ flowrate of between 1,000 sccm and 4,000 sccm and a $N_2$ flowrate between 100 sccm and 400 sccm.

18. The method of claim 1, wherein the step of removing a residual portion of the photoresist etch mask (h) further comprises a step (h1) of performing a wet rinse process on the substrate after the residual portion of the photoresist etch mask has been removed.

19. The method of claim 18, wherein the step (h1) of applying the wet rinse process further comprises the steps of:

(h1a) initiating the wet rinse process using a buffered oxide etchant (BOE) having a ratio of approximately 300:1 for a duration of between 2 seconds and 10 seconds; and (h1b) completing the wet rinse process using a liquid mixture of $H_2SO_4$ and $H_2O_2$, the $H_2SO_4:H_2O_2$ ratio being approximately 50:1, at a temperature between 100° C. and 120° C., and having a duration of between 10 minutes and 20 minutes.

\* \* \* \* \*